United States Patent [19]

Vittoz

[11] 4,068,137

[45] Jan. 10, 1978

[54] BINARY FREQUENCY DIVIDER

[75] Inventor: Eric André Vittoz, Cernier, Switzerland

[73] Assignee: Centre Electronique Horloger S.A., Switzerland

[21] Appl. No.: 721,228

[22] Filed: Sept. 8, 1976

[30] Foreign Application Priority Data

Sept. 17, 1975 Switzerland .................. 12040/75

[51] Int. Cl.² .............. H03K 23/30; H03K 21/00
[52] U.S. Cl. .................. 307/225 C; 307/224 C; 307/251; 307/279
[58] Field of Search ........... 307/205 C, 220 R, 220 C, 307/221 R, 221 C, 224 R, 224 C, 225 R, 225 C, 251, 255, 279, 288

[56] References Cited

U.S. PATENT DOCUMENTS

| 3,619,646 | 11/1971 | Vittoz | 307/225 C |
| 3,760,580 | 9/1973 | Fujita | 307/225 C X |
| 3,829,714 | 8/1974 | Vittoz | 307/225 C |
| 3,928,773 | 12/1975 | Oguey et al. | 307/225 C |

OTHER PUBLICATIONS

Oguey et al, "CODYMOS Frequency Dividers Achieve Low Power Consumption and High Frequency"; Electronic Letters (pub.) Aug. 23, 1973, vol. 9, No. 17.

Primary Examiner—Larry N. Anagnos
Attorney, Agent, or Firm—Stevens, Davis, Miller & Mosher

[57] ABSTRACT

A binary frequency divider circuit with insulated gate field effect transistors (MOST) powered by a constant voltage source is derived from a known static circuit by eliminating transistors that do not take part in switching, which allows nodes of the circuit to float. Certain transistors, which are eliminated in known dynamic circuits, are retained so that the nodes float for only one value of an input variable, but not for the other.

9 Claims, 4 Drawing Figures

BINARY FREQUENCY DIVIDER

The invention relates to binary frequency divider circuits.

U.S. Pat. No. 3,928,773 discloses a binary frequency divider stage circuit with insulated gate field effect transistors (MOST) powered by a constant voltage source, comprising an input for introducing an input signal and at least three logical nodes, each logical node being an interconnection between the drains of at least one n-channel MOST and at least one p-channel MOST, each logical node being connected to control means of at least one other node and being able to be used as an output, the source of one of the MOST of at least one of the nodes being connected to one terminal of the voltage source and the source of the other MOST of the same node being connected to the drain of a third MOST, the source of which is connected to the other terminal of the voltage source, the node establishing the interconnection between the drains of the p- and n-channel MOST being controlled by two variables, one being the input signal and the other being the signal from another logical node, in such a way that one variable drives the gates of the third MOST and one p-channel MOST, and the other variable drives the gate of the n-channel MOST, allowing the corresponding node to float when this transistor as well as the complementary transistor driven by the other variable are both blocked.

Various circuits with complementary MOST for dividing by two are known; some are static dividers, and others dynamic dividers. Static dividers can be obtained by directly performing the logical equations by means of two-level gates. Their operation is assured as long as the input frequency is less than a limiting value. The simplest of these circuits comprises sixteen transistors (see ISSCC Digest, 1967, pp 52–53), but requires two input signals, one in its true form, the other in its complementary form. Morevoer, its layout is poorly adapted for compact integration. It is also possible to have only a single input: the simplest single-input static circuit has nineteen transistors, an example being given in FIG. 5 of U.S. Pat. No. 3,829,714. Dynamic dividers can be obtained by eliminating from the static circuits all of the transistors that do not take part in switching. These circuits are much simpler, their limiting operating frequency is greater and their consumption lower, but operation is only ensured if the operating frequency is above a limiting value (of several kHz). The simplest dynamic circuits have nine transistors; an example is shown in FIG. 9 of U.S. Pat. No. 3,928,773.

An aim of the invention is a simplification of static divider circuits that does not produce a lower frequency limit, nor an additional static consumption. To this end, the known principle of eliminating one or several transistors that do not take part in the switching is applied, which ensures that the consumption remains low, but certain transistors are retained in a manner to ensure that for one of the two states of the input variable no node floats, whereas one or several nodes may float for the second state. The thus-simplified circuit operates correctly with no lower frequency limit, provided that the input signal remains in the second state for very brief periods (short pulses).

To achieve this aim, the invention proposes a variation of the circuit defined at the outset, characterized in that for one of the two logical states of the input, each node is connected, by one or more conducting MOST, to either pole of the constant voltage source, so that said nodes do not float.

It is another aim of the invention to present circuits requiring less surface area if integrated than known static divider circuits. The gain in area improves fabrication yield, allows a larger number of circuits per wafer, and reduces production costs.

The invention will be described in detail with reference to the accompanying drawings which show, by way of example, two embodiments, and in which.

Figure 1:
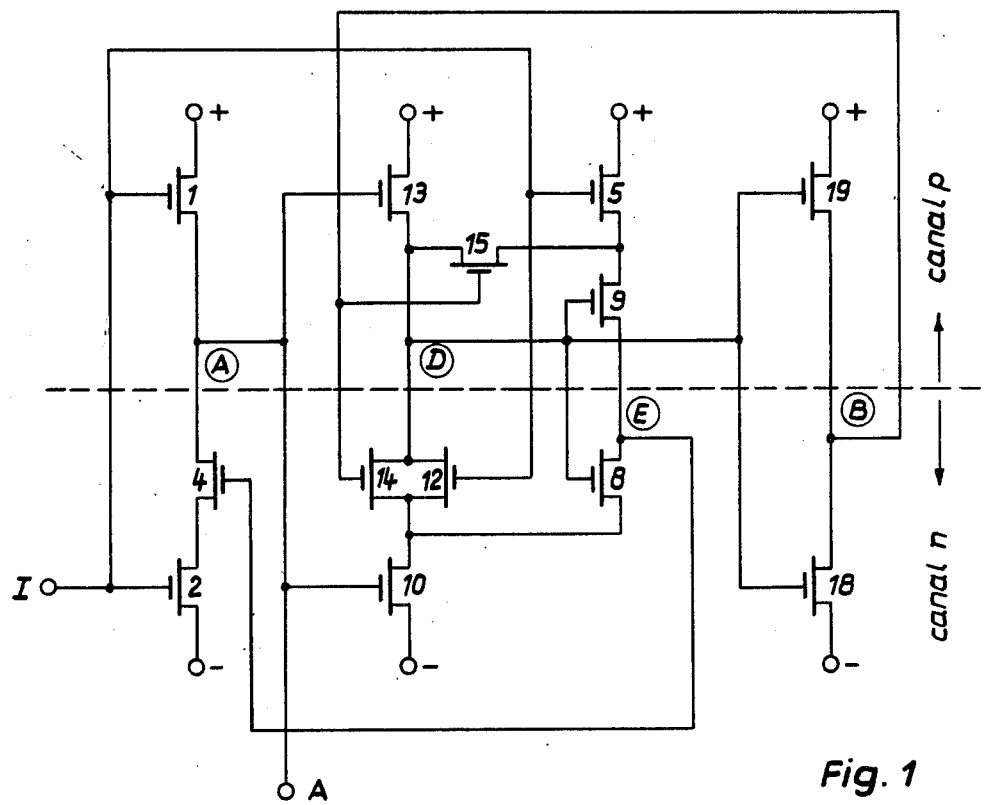
FIG. 1 is a diagram of a first circuit according to the invention.

FIG. 1 shows an example of a circuit according to the invention derived from the dynamic circuit shown in FIG. 9 of U.S. Pat. No. 3,928,773. This circuit comprises, in addition to transistors 1, 2, 4, 5, 8, 9, 10, 12 and 13, four transistors 14, 15, 18 and 19 the purpose of which is to maintain stable states when the input I is at 0. These four transistors were present in the corresponding static circuit shown in FIG. 8 of U.S. Pat. No. 3,928,773; they simply have not been eliminated.

Figure 2:
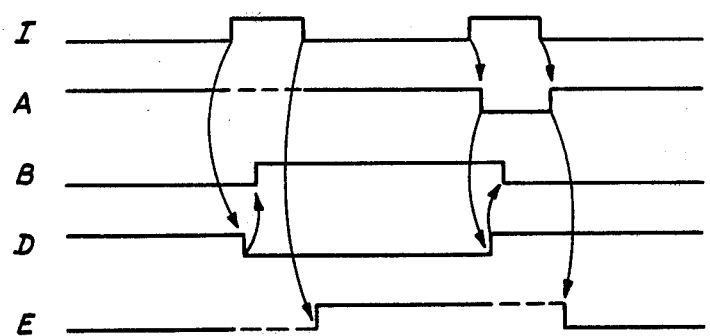
FIG. 2 illustrates operation of this first circuit.

FIG. 2 shows the logical signals corresponding to the circuit of FIG. 1; the full lines represent the states maintained by the transistors, and the dashed lines the states maintained by the residual capacitances at the node A or E.

If the positive pulses at the input I are sufficiently short, this circuit operates correctly without a lower frequency limit. Also, since this circuit is derived by eliminating certain transistors from the corresponding static circuit (i.e. transistors 3, 6, 7, 11, 16 and 17 of FIG. 8 of U.S. Pat. No. 3,928,773), its static consumption is reduced to the leakage currents of the transistors, there being no other conducting path between the + and − supply terminals.

Figure 3:
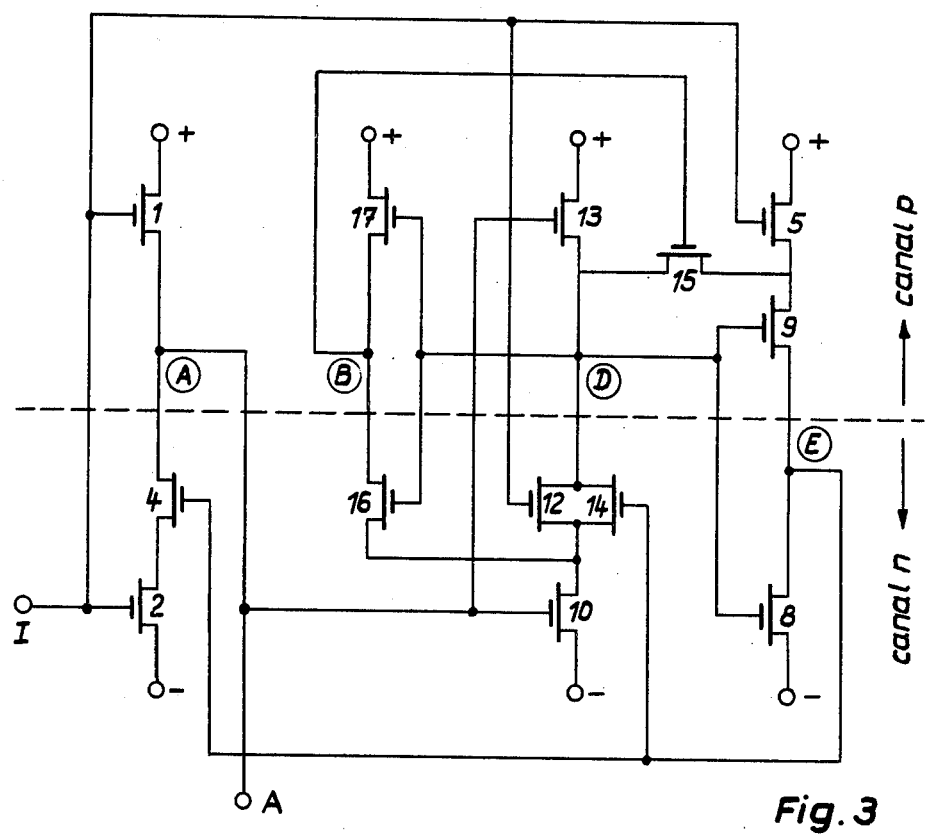
FIG. 3 is a diagram of a second circuit according to the invention.

FIG. 3 shows another embodiment of the invention derived from a known dynamic circuit, formed of transistors 1, 2, 4, 5, 8, 9, 10, 12 and 13 (see "Electronics Letters", Aug. 23, 1973, Vol 9 No. 17, FIG. 16; the variables B and C of FIG. 16 correspond respectively to variables D and E of the accompanying FIG. 3). To this known circuit have been added four transistors 14, 15, 16 and 17 to maintain stable states while I is at 0.

Figure 4:
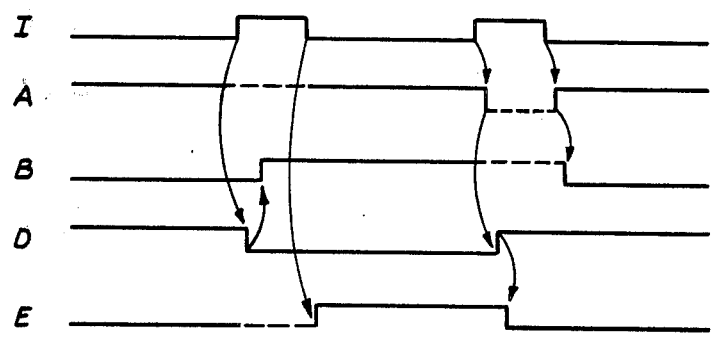
FIG. 4 illustrates operation of this second circuit.

FIG. 4 shows the corresponding logical signals which are very similar to those of FIG. 2, only the order of the return to 0 of variables B and E has been inverted.

Operation of the two circuits according to the invention will now be described in detail.

For the circuit of FIG. 1, the initial state is I = 0, A = 1, B = 0, D = 1, E = 0.

Transistors 1, 5, 8, 10, 15 and 18 conduct whereas transistors 2, 4, 9, 12, 13, 14 and 19 are blocked. This state is stable.

When I passes to 1, transistors 1 and 5 block and transistors 2 and 12 become conducting. Because transistors 12 and 10 conduct while 5 and 13 are blocked, the variable D passes to 0. The passage of D to zero blocks transistors 8 and 18 and causes conduction of transistors 9 and 19. Variable B thus passes to 1, causing conduction of transistor 14 (connected in parallel to transistor 12, which is already conducting) and blocking transistor 15 (which is in series with the already-blocked transistor 5). This new state is stable. However, since transistors 1 and 4 are blocked, the node A floats; it remains in the logical state 1 as long as the leakage currents have not had time to sufficiently modify the charge of the stray capacitance associated with A. The same applies to node E (at 0) since transistors 8 and 5 are blocked.

When I returns to 0, transistors 2 and 12 block, while 1 and 5 become conducting. Node E is brought to 1 by transistors 5 and 9, and causes conduction of transistor 4, this having no consequence because transistor 2 is blocked. This state is stable whatever may be the leakage currents.

When I becomes again 1, transistors 1 and 5 block and 2 and 12 become conducting. As transistor 4 is already conducting, A passes to 0, causing blocking of transistor 10 and conduction of 13. D thus passes to 1, which produces blocking of transistors 9 and 19 and the conduction of 8 and 18. B thus passes to 0, blocking transistor 14 (which is of no consequence because transistor 12 is conducting) and making transistor 15 conduct (which is of no consequence because transistor 5 is blocked). The circuit has reached a new stable state for which variable E floats at 1, transistors 5, 9 and 10 being blocked.

When I returns to 0, transistors 1 and 5 once more become conducting, while transistors 2 and 12 are blocked. A passes to 1, causing blocking of transistor 13 and conduction of 10. As transistors 8 and 10 conduct, E passes to 0 causing blocking of transistor 4 (which is of no consequence because transistor 2 is already blocked). The circuit has thus reached a new stable state identical to the initial state.

During this cycle, the input variable I has made four transitions, whereas the output variable A has made only two transitions. There is hence a division by two.

The state of conduction (C) or blocking (B) of each transistor during the cycle is indicated by the following table:

Starting from the same logical state, a similar reasoning can be applied to the circuit of FIG. 3, operation being summarized by the following table:

| I | A | B | D | E | p 1 | 5 | 9 | 13 | 15 | 17 | n 2 | 4 | 8 | 10 | 12 | 14 | 16 | |
|---|---|---|---|---|---|---|---|----|----|----|---|---|---|----|----|----|----|---|
| 0 | 1 | 0 | 1 | 0 | C | C | B | B | C | B | B | B | C | C | B | B | C | stable |
| 1 | 1 | 0 | 1 | 0 | B | B | | | | | | C | | | | C | | |
| 1 | 1 | 0 | 0 | 0 | | | C | | | C | | | B | | | | B | |
| 1 | 1 | 1 | 0 | 0 | | | | | B | | | | | | | | | stable |
| 0 | 1 | 1 | 0 | 0 | C | C | | | | | B | | | | B | | | |
| 0 | 1 | 1 | 0 | 1 | | | | | | | | | C | | | | | stable |
| 1 | 1 | 1 | 0 | 1 | B | B | | | | | C | | | | C | | | |
| 1 | 0 | 1 | 0 | 1 | | | | C | | | | | | B | | | | |
| 1 | 0 | 1 | 1 | 1 | | | B | | B | | | C | | | | C | | |
| 1 | 0 | 1 | 1 | 0 | | | | | | | B | | | | B | | | stable |
| 0 | 0 | 1 | 1 | 0 | C | C | | | | | B | | | | B | | | |
| 0 | 1 | 1 | 1 | 0 | | | B | | | | | | C | | | | | |
| 0 | 1 | 0 | 1 | 0 | | | | C | | | | | | | | | | stable |

To both of the preceding circuits correspond still two other so called dual circuits. A circuit is dual to a given one if any n-type transistor of the first one corresponds to a p-type transistor of the second one, and the polarity of all voltages and currents are reversed.

It is possible to form a dividing chain, by alternating one of the preceding circuits with its dual circuit and controlling each stage (input I) by the variable A of the preceding stage. One thus obtains a chain of any length comprising thirteen transistors per stage.

What is claimed is:

1. In a binary frequency divider stage circuit with complementary insulated gate field effect transistors (MOST) powered by a constant voltage source, comprising an input for introducing an input signal and at least three logical nodes, at least one output (A) connected to one of said three nodes, each logical node being an interconnection between the drains of at least one n-channel MOST and at last one p-channel MOST, each logical node being connected to at least one of said p- and n-channel MOST of at least one other node the source of one of the p- and n-channel MOST (1) of at least one of the nodes being connected to one terminal of the voltage source and the source of the p- and n-channel MOST (4) of the same node being connected to the drain of a third MOST (2), the source of which is connected to the other terminal of the voltage source, said p- and n-channel MOST and said third MOST of said one node arranged such that said one node is controlled by two variables, one being the input signal (I) and the other being the signal from another logical node (E), in such a way that one variable drives the gate(s) of the third MOST and the gate of the one of said p- and n-channel MOST having a channel type opposed to that of said third MOST and the other variable drives the gate of the other p- and n-channel MOST, allowing the

| I | A | B | D | E | p 1 | 5 | 9 | 13 | 15 | 19 | n 2 | 4 | 8 | 10 | 12 | 14 | 18 | |
|---|---|---|---|---|---|---|---|----|----|----|---|---|---|----|----|----|----|---|
| 0 | 1 | 0 | 1 | 0 | C | C | B | B | C | B | B | B | C | C | B | B | C | stable |
| 1 | 1 | 0 | 1 | 0 | B | B | | | | | | C | | | | C | | |
| 1 | 1 | 0 | 0 | 0 | | | C | | | C | | | B | | | | B | |
| 1 | 1 | 1 | 0 | 0 | | | | | B | | | | | | | | C | stable |
| 0 | 1 | 1 | 0 | 0 | C | C | | | | | B | | | | B | | | |
| 0 | 1 | 1 | 0 | 1 | | | | | | | | C | | | | | | stable |
| 1 | 1 | 1 | 0 | 1 | B | B | | | | | C | | | | C | | | |
| 1 | 0 | 1 | 0 | 1 | | | | C | | | | | | B | | | | |
| 1 | 0 | 1 | 1 | 1 | | | B | | B | | | C | | | | C | | |
| 1 | 0 | 0 | 1 | 1 | | | | | C | | | | | | B | | | stable |
| 0 | 0 | 0 | 1 | 1 | C | C | | | | | B | | | | B | | | |
| 0 | 1 | 0 | 1 | 1 | | | | B | | | | | | C | | | | |
| 0 | 1 | 0 | 1 | 0 | | | | | | | B | | | | | | | stable | corresponding node to float when said p-channel MOST as well as said n-channel MOST of said one node are both blocked, the improvement comprising means for connecting each node, for one only of the two logical states of said input, by at least one conducting MOST, to either terminal of said constant voltage source, whereby said nodes do not float for said one logical state of said input.

2. A circuit according to claim 1, wherein each transistor has a source, a gate, and a drain and further comprising an input terminal (I), a first transistor (1) and second transistor (2) each having its gate connected to said input terminal, said first transistor (1) having its source connected to a potential of a first polarity and having its drain connected to the drain of a third transistor, (4), the source of said third transistor (4) connected to the drain of said second transistor (2), the source of said second transistor connected to a potential of a second polarity, said input terminal connected to the gate of a fifth transistor (5) and a gate of a twelfth transistor (12), the source of said fifth transistor (5), connected to said potential of a first polarity, the drain of said fifth transistor (5) connected to the source of a ninth transistor (9), the drain of the said ninth transistor connected to the drain of an eighth transistor (8), the source of said eighth transistor connected to the drain of a tenth transistor (10), the source of said tenth transistor (10) connected to said potential of a second polarity, the gate of said tenth transistor (10) connected to the drain of said first transistor (1) and being further connected to the gate of a fourth transistor (13), the source of said fourth transistor (13) connected to said potential of a first polarity, the drain of said fourth transistor (13) connected to the drain of a sixth transistor (15) and further connected to the drains of a twelfth (12) and seventh transistor (14), the sources of said twelfth (12) and seventh transistors (14) being connected to the drain of said tenth transistor (10), the gate of said seventh (14) and sixth transistor (15) connected to the connection point of the drain of an eleventh (18) and a thirteenth transistor (19), the source of said thirteenth transistor (19) connected to said potential of a first polarity, the source of said eleventh transistor (18) connected to said potential of a second polarity, the gates of said eleventh (18) and thirteenth transistor (13) connected to the gate of said ninth transistor (9) and said eighth transistors (8) and further connected to the drain of said seventh (14) transistor, the drain of said ninth (9) transistor connected to the gate of said third transistor, the interconnection of the drains of said first and third transistors defining one of said at least three nodes, the interconnection of the drains of said fourth and said seventh transistor defining a second of said at least three nodes, the interconnection of the drains of said ninth and said eighth transistors defining a third of said at least three nodes, and said output terminal connected to at least one of said three nodes.

3. A circuit according to claim 2, wherein said first, fourth, fifth, sixth, ninth, and thirteenth transistors are of the p-type, said second, third, seventh, eighth, tenth, eleventh, and twelfth transistors are of the n-type, said potential of a first polarity is positive and said potential of a second polarity is negative.

4. A circuit according to claim 2, wherein said first, fourth, fifth, sixth, ninth, and thirteenth transistors are of the n-type, said second, third, seventh, eighth, tenth, eleventh, and twelfth transistors are of the p-type, said potential of a first polarity is negative, and said potential of a second polarity is positive.

5. A circuit according to claim 1 wherein each transistor has a source, a gate and a drain and further comprising an input terminal (I) connected to the gates of a first (1), a second (2), a fifth (5), and a twelfth transistor (12), the source of said first transistor (1) connected to a potential of a first polarity, the drain of said first transistor connected to the drain of a fourth transistor (4), the source of said fourth transistor (4) connected to the drain of said second transistor (2), the source of said second transistor (2) connected to a potential of a second polarity, the source of said fifth transistor (5) connected to said potential of a first polarity, the drain of said fifth transistor connected to the source of a ninth transistor (9), the drain of said ninth transistor (9) connected to the drain of an eighth transistor (8), the source of said eighth transistor connected to said potential of a first polarity, the connection point of the drains of said ninth (9) and eighth transistors (8) connected to the gate of said fourth transistor (4), the gates of said eighth (8) and said ninth (9) transistors connected to the interconnection point of the drains of a thirteenth (13) and eleventh transistors (14), and further connected to the gates of a third (17) and sixth transistor 16), the source of said thirteenth transistor connected to said potential of a first polarity, the source of said eleventh transistor (14) connected to the source of said twelfth transistor (12) and further connected to the drain of a tenth transistor (10), the source of said tenth transistor connected to said potential of a second polarity, the drain of said eleventh transistor (14) further connected to the drain of said twelfth transistor (12), the source of said eleventh transistor further connected to the source of said sixth transistor (16), the drain of said sixth transistor (16) connected to the drain of said third transistor (17), the source of said third transistor (17) connected to said potential of a first polarity, the interconnection of the drains of said third (17) and said sixth transistor (16) connected to the gate of a seventh transistor (15), the drain of said seventh transistor connected to the drain of said thirteenth transistor (13), the source of said seventh transistor connected to said drain of said fifth transistor (5), the gate of said thirteenth (13) transistor and the gate of said tenth transistor (10) connected to the interconnection of the drains of said first (1) and fourth transistors (4), the interconnection of the drains of said first and fourth transistors defining one of said at least three nodes, the interconnection of the drains of said thirteenth and said eleventh transistors defining a second of said at least three nodes, the interconnection of the drains of said ninth and eighth transistors defining a third of said at least three nodes, said output terminal connected to one of said at least three nodes.

6. A circuit according to claim 5, wherein said first, third, fifth, seventh, ninth, and thirteenth transistors are of the p-type, said second fourth, sixth, eighth, tenth, eleventh, and twelfth transistors are of the n-type, said potential of a first polarity is positive and said potential of a second polarity is negative.

7. A circuit according to claim 5, wherein said first, third, fifth, seventh, ninth, and thirteenth transistors are of the n-type, said seventh, fourth, sixth, eighth, tenth, eleventh, and twelfth transistors are of the p-type, said potential of a first polarity is negative and said potential of a second polarity is positive.

8. A first circuit according to claim 1 having a second but output connected to the input of its complementary circuit, said complementary circuit containing an n-type and p-type MOST where said first circuit contains a p-type and n-type MOST respectively, said complementary circuit also containing a positive and negative potential connected in circuit where said first circuit contains a negative and positive potential respectively, said serial connection of said first circuit with its complementary forming a binary dividing circuit.

9. A circuit according to claim 8 wherein a plurality of said first circuits and a plurality of said complementary circuits are alternately connected in series to form a binary dividing chain.

* * * * *